United States Patent [19]

Chen et al.

[11] Patent Number: 4,534,816

[45] Date of Patent: Aug. 13, 1985

[54] SINGLE WAFER PLASMA ETCH REACTOR

[75] Inventors: Lee Chen, Poughkeepsie; Charles J. Hendricks, Wappingers Falls; Gangadhara S. Mathad, Poughkeepsie; Stanley J. Poloncic, Wappingers Falls, all of N.Y.

[73] Assignee: International Business Machines Corporation, Armonk, N.Y.

[21] Appl. No.: 623,670

[22] Filed: Jun. 22, 1984

[51] Int. Cl.³ .................. H01L 21/306; B44C 1/22; C03C 15/00; C23F 1/02
[52] U.S. Cl. ............................. 156/345; 156/643; 204/298
[58] Field of Search ............... 156/345, 643, 646; 204/164, 192 E, 298; 427/38, 39; 118/728, 50, 620

[56] References Cited

U.S. PATENT DOCUMENTS

| | | | |
|---|---|---|---|
| 4,209,357 | 6/1980 | Gorin et al. | 156/643 |
| 4,297,162 | 10/1981 | Mundt et al. | 156/643 |
| 4,324,611 | 4/1982 | Vogel et al. | 156/643 |
| 4,340,461 | 7/1982 | Hendricks et al. | 204/298 |
| 4,340,462 | 7/1982 | Koch | 204/298 |
| 4,367,114 | 1/1983 | Steinberg et al. | 156/345 |

OTHER PUBLICATIONS

IBM Technical Disclosure Bulletin, vol. 26, No. 7B, Dec. 1983, Plasma Etching Chamber, B. H. Desilets, pp. 3567-3569.
L. M. Ephrath, "Plasma Reactor for Dry Development of Resist", IBM Tech. Disc. Bull., vol. 24, No. 12, pp. 6268-6269, May 1982.

Primary Examiner—William A. Powell
Attorney, Agent, or Firm—Douglas A. Lashmit

[57] ABSTRACT

A high pressure, high etch rate single wafer plasma reactor having a fluid cooled upper electrode including a plurality of small diameter holes or passages therethrough to provide uniform reactive gas distribution over the surface of a wafer to be etched. A fluid cooled lower electrode is spaced from the upper electrode to provide an aspect ratio (wafer diameter: spacing) greater than about 25, and includes an insulating ring at its upper surface. The insulating ring protrudes above the exposed surface of the lower electrode to control the electrode spacing and to provide a plasma confinement region whereby substantially all of the RF power is dissipated by the wafer. A plurality of spaced apart, radially extending passages through the insulating ring provide a means of uniformly exhausting the reactive gas from the plasma confinement region. Affixed to the upper electrode is a first housing which supplies reactive gas and cooling fluid, and a baffle affixed to the first housing intermediate the upper electrode and a gas inlet forms a plenum above the upper electrode and ensures uniform reactive gas distribution thereover. The first housing and upper electrode are contained within a second housing with an insulating housing therebetween. The upper and lower electrodes are electrically isolated from each other and from ground, so that either or both electrodes may be powered.

14 Claims, 8 Drawing Figures

SINGLE WAFER PLASMA ETCH REACTOR

BACKGROUND OF THE INVENTION

The present invention relates generally to apparatus for plasma etching semiconductor wafers and more particularly to a high pressure, high etch rate reactor for etching a single semiconductor wafer.

In the fabrication of semiconductor devices, the use of plasma etching has several advantages over conventional wet etching. Among these are anisotropy, better resolution, and the elimination of problems inherent in the use of wet etch chemicals. Further, the use of single wafer, plasma etching systems offers the advantages of higher etch rates and improved etch uniformity as compared to multiple wafer or batch-type reactors. As linewidths decrease, for example, in very large scale integrated circuit devices, etch uniformity, or achieving a uniform etch rate across the surface of the wafer, and wafer-to-wafer becomes even more critical because of the increased number of devices on each wafer.

Single wafer, parallel plate plasma reactors are disclosed in U.S. Pat. No. 4,209,357 to Gorin et al., entitled "Plasma Reactor Apparatus", and U.S. Pat. No. 4,324,611 to Vogel et al., entitled "Process and Gas Mixture for Etching Silicon Dioxide and Silicon Nitride". The latter patent describes the use of secondary and tertiary reactive gases in a conventional reactor, and the former patent describes a reactor wherein the upper electrode includes both reactive gas supply means and exhaust means. In U.S. Pat. No. 4,297,162 to Mundt et al., entitled "Plasma Etching Using Improved Electrode", the reactor includes a curved upper electrode which is said to improve etch uniformity across the surface of the wafer. In some of these systems a wafer is fully exposed to the upper electrode, in other systems, such as the one disclosed in U.S. Pat. No. 4,367,114, an insulating ring is used as a partial confining wall and clamps the wafer to the lower electrode to ensure electrical contact. In such systems, the edge portion of the wafer that is clamped cannot be used for the fabrication of integrated circuit devices.

Current low (<100 microns) and medium pressure (<500 microns) plasma systems have exhibited relatively low etch rates and correspondingly long etch times, particularly when etching films greater than about one micron in thickness. In addition, when reactive gas pressure and RF power are increased in an attemmpt to increase the etch rate, the etch uniformity is degraded with an accompanying decrease in yield.

SUMMARY OF THE INVENTION

To achieve high etch rates with good uniformity it is necessary to generate a uniform high density plasma over the wafer. One method is to use a very small reactor volume, e.g., by employing a small inter-electrode gap for a given wafer size, so that for an input of reasonably low area power density, high volume power densities can be obtained. One result of low inter-electrode spacing or high aspect ratio (wafer diameter:spacing) is the efficient use of secondary electrons which cause many more surface and gas collisions, before they are lost to the walls, as compared to when the aspect ratio is small. In such a case, the desirable condition, where most of the input power is used in producing plasma of low impedance rather than one with high sheath voltage, is obtained. The critical factors in the fabrication of such a reactor include electrode parallelism at low inter-electrode spacings, efficient wafer cooling, confinement of plasma over the wafer to minimize RF and plasma leaks away from the reaction zone, uniform gas distribution and pump-out, and minimized RF and gas flow disturbances around the edge of the wafer.

Accordingly, the present invention overcomes many of the disadvantages of prior systems by incorporating the above features to provide a single wafer, high pressure, high plasma density, high etch rate parallel plate reactive plasma etching system with improved etch uniformity and without resist degradation at high volume power densities.

In one embodiment of the present reactor, a fluid cooled upper electrode includes a plurality of small diameter holes or passages therethrough to provide uniform reactive gas distribution over the surface of a wafer to be etched. A fluid cooled lower electrode is spaced less than about 4 mm. from the upper electrode and includes an insulating ring at its upper surface. For a 125 mm. diameter wafer, a 4 mm. spacing results in an aspect ratio of about 31. The insulating ring protrudes above the exposed surface of the lower electrode to control the electrode spacing and to provide a plasma confinement region whereby substantially all of the RF power is dissipated by the wafer. A plurality of spaced apart, radially extending passages through the insulating ring provide a means of uniformly exhausting the reactive gas from the plasma confinement region. Affixed to the upper electrode is a first housing which supplies reactive gas and cooling fluid, and a baffle affixed to the first housing intermediate the upper electrode and a gas inlet forms a plenum above the upper electrode and ensures uniform reactive gas distribution thereover. The first housing and upper electrode are contained within a second housing with an insulating housing therebetween. The upper and lower electrodes are electrically isolated from each other and from ground, so that either or both electrodes may be powered.

It is therefore an object of the present invention to provide a high pressure, high etch rate plasma reactor with improved etch uniformity.

Another object of this invention is to provide an improved high pressure, single wafer plasma reactor having fluid cooled upper and lower electrodes in a parallel plate configuration to facilitate cooling of the wafer from both sides.

Yet another object of the present invention is to provide a single wafer plasma reactor wherein the electrode spacing is adjustable such that an aspect ratio of 25 can be maintained, and wherein high reactive gas pressure and high volume density RF power are combined to achieve high plasma density etch rate without sacrificing etch uniformity, and without causing resist degradation.

BRIEF DESCRIPTION OF THE DRAWINGS

Other objects and many of the attendant advantages of the present invention will be better understood by reference to the following detailed description in conjunction with the accompanying drawings, in which like reference numerals designate the same or similar parts throughout the several views, and wherein.

DETAILED DESCRIPTION OF THE PREFERRED EMBODIMENT

Figure 1:
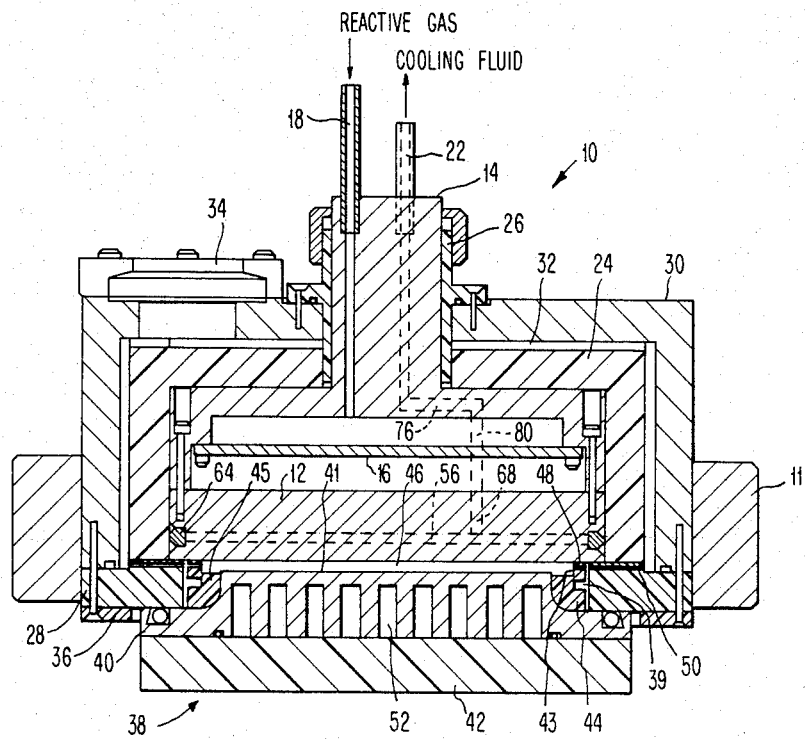
FIG. 1 is a cross-sectional view in elevation of a plasma reactor according to one embodiment of the present invention.

Referring now to the drawings, there is shown in FIG. 1 a single wafer plasma reactor 10, according to one embodiment of the present invention, wherein a circular, electrically conductive upper electrode 12 is affixed to a cylindrical inner housing 14. Housing 14 is conductive and includes a perforated baffle 16 affixed thereto which forms a plenum to facilitate the uniform distribution of a reactive gas over electrode 12. Housing 14 also includes a reactive gas inlet passageway 18, and cooling fluid inlet 20 and outlet 22 passageways (only outlet passageway 22 is visible in FIG. 1) for supplying cooling fluid to and returning the fluid from upper electrode 12, as will be described in more detail below. The electrode 12 and inner housing 14 assembly is contained within an insulating housing formed of insulator 24, bushing 26, and exhaust and spacing ring 28 to provide electrical isolation of the upper electrode assembly and set the inter-electrode gap. Surrounding insulator 24 is a cylindrical outer housing 30 which contacts bushing 26 and is affixed to exhaust ring 28, but is spaced apart from insulator 24 to provide a gap 32 therebetween to transfer reactive gas to an exhaust assembly 34 at the upper portion of outer housing 30. Housing 30 may be either conductive or non-conductive and is affixed to exhaust and spacing ring 28 by means of a clamp ring 36. The entire reactor assembly is held and positioned with respect to a reference surface by a ring clamp 11.

Reactor 10 includes a lower electrode assembly 38 which is formed in one embodiment of a conductive upper section 40 and an insulating lower section 42 to provide electrical isolation. Upper section 40 has a central raised portion which is surrounded by an insulating ring 44 having a flange or channel formed into its uppermost inner edge. In this manner the vertical inner surface 43 of ring 44 is spaced apart from the exposed surface 41 of electrode 40, while the horizontal surface 45 of the inner channel of ring 44 is displaced below the upper surface of electrode 40. An optional peripheral groove 39 may be formed in insulating ring 44 to provide a means for auto-positioning a wafer on lower electrode 40. During transfer, when auto-transport is used, the wafer is supported on surface 45 of ring 44 while the ring is separated from upper section 40 of electrode 38 by wafer handling apparatus (not shown). In the case where auto loading and unloading of a wafer is not used, the ring 44, without the groove 39, remains fixed to the conductive portion 40 of the lower electrode 38. When reactor 10 is in the closed position as shown in FIG. 1, the depressed surface of the conductive section 40 of lower electrode 38 is pressed against the exhaust and spacing ring 28, and insulating ring 44 is in contact with upper electrode 12. The protrusion of the upper surface of ring 44 above the exposed surface 41 of lower electrode section 40 forms an enclosed plasma confinement region 46 between upper electrode 12 and surface 41. The spacing and parallelism between upper electrode 12 and lower electrode 38 which is set by the thickness of ring 28 is preferably less than about 4 mm to increase the volume power density in region 46. Alternatively, a 10–15 mil gap above ring 44, instead of passageway 48 will also confine the plasma, though not very efficiently. Insulating ring 44 and exhaust ring 28 include radially extending passageways 48 and 50, respectively, therethrough to provide means for exhausting reactive gas from plasma region 46. Ring 28, in addition to passageways 50, may have an exhaust manifold or groove (not shown) formed into its inner surface so that the passageways 48 and 50 need not be aligned to effectively exhaust the gases. The passageways 50 in exhaust ring 28 open into the gap 32 between insulator 24 and outer housing 30. The reactive gas thus enters through inlet 18, then passes through baffle 16 and upper electrode 12 into the plasma region 46, through passageways 48 and 50, through gap 32 and out exhaust assembly 34 in outer housing 30.

The lower surface of the upper section 40 of lower electrode 38 has a channel 52 formed therein which, when sections 40 and 42 are assembled, forms an enclosed passageway for directing cooling fluid therethrough. Cooling channel 52 has, in one embodiment, a serpentine configuration which forms a single continuous passageway. The cooling fluid may be supplied by the same source that supplies upper electrode 12, or separate cooling fluid sources may be employed. In this manner, the operating temperatures of electrodes 12 and 38 may be precisely and individually controlled.

Electrodes 12 and 38 are electrically isolated from each other and are ungrounded, therefore, either or both electrodes may be coupled to a source of RF power (not shown), with the other electrode being grounded during operation. When powering the upper electrode, to avoid plasma being sustained in the annular space 32, a ground shield may cover the entire outer surface of the insulator housing 24. In this arrangement, the reactor can also conveniently be operated in triode, frequency mixing, and substrate tuning modes wherein both electrodes are powered. A semiconductor wafer to be etched is placed onto lower electrode 38 by either raising the upper electrode assembly which includes electrode 12 and housings 14, 24 and 30, or by lowering lower electrode 38. Conventional wafer handling apparatus may be employed in either instance.

Figure 2:
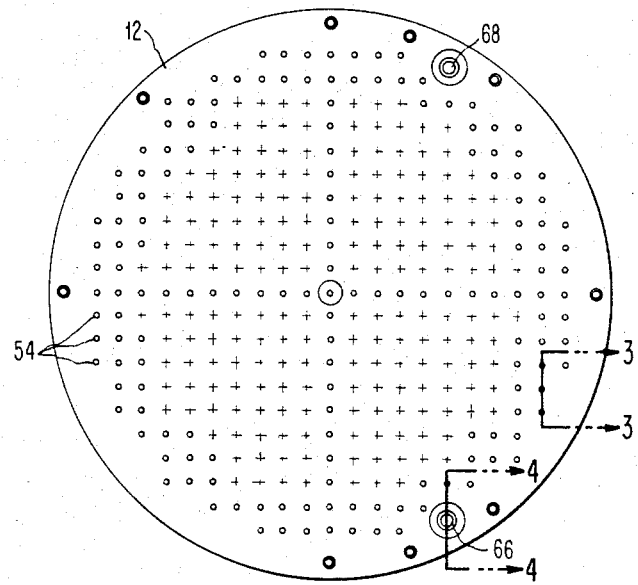
FIG. 2 is a top plan view of the plasma reactor upper electrode.
Figure 3:
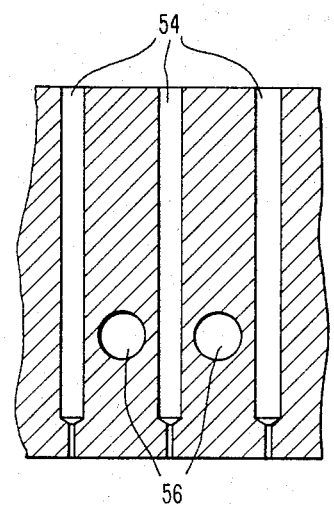
FIG. 3 is a cross-sectional view in elevation of a portion of the upper electrode taken along line 3—3 in FIG. 2.
Figure 4:
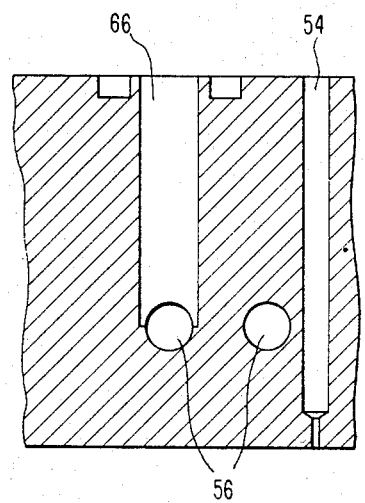
FIG. 4 is a cross-sectional view in elevation of another portion of the upper electrode taken along line 4—4 in FIG. 2.

FIGS. 2-6 show upper electrode 12 in greater detail. Referring to FIG. 2, electrode 12 includes a plurality of spaced apart openings or passageways 54 extending vertically therethrough. In the present embodiment, as shown in FIGS. 3 and 4, the upper portion of each passageway 54 is of one diameter while the lower portion is of a smaller diameter. This facilitates fabrication of electrode 12 because it is difficult to form a small diameter hole, for example, on the order of about 0.1–0.4 mm., entirely through the electrode, which may have a thickness of about 25 mm. The small openings of passageways 54 at the lower surface of electrode 12 are necessary in order to uniformly distribute a reactive gas over the surface of a wafer therebeneath, and to prevent the plasma from forming inside the passageways.

Figure 5:
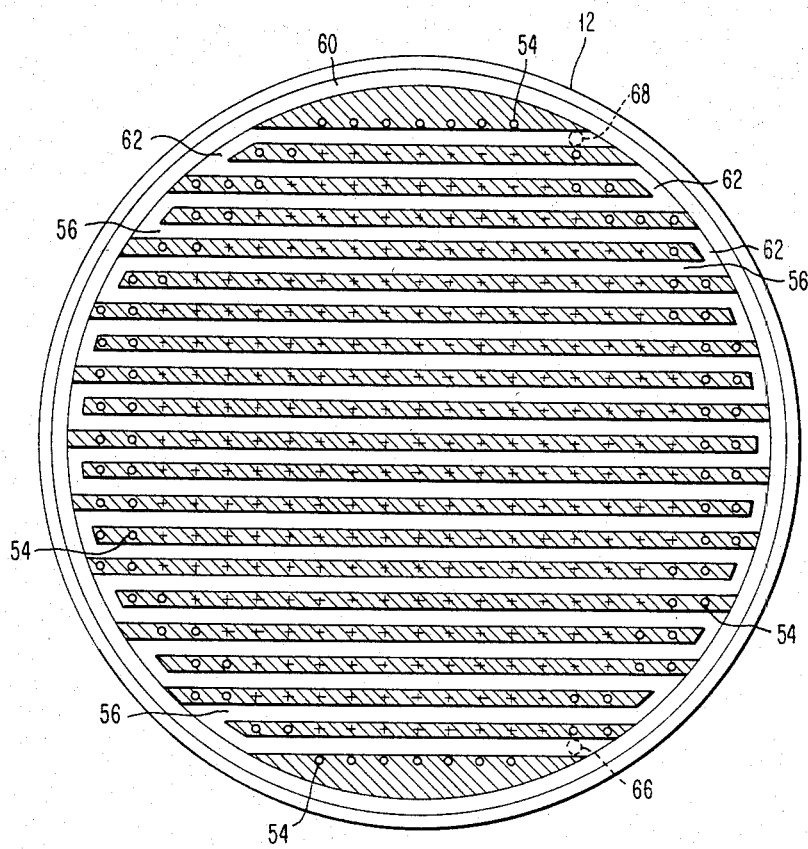
FIG. 5 is a top cross-sectional view of the upper electrode taken along line 5—5 in FIG. 6, showing the details of the internal cooling passage.
Figure 6:
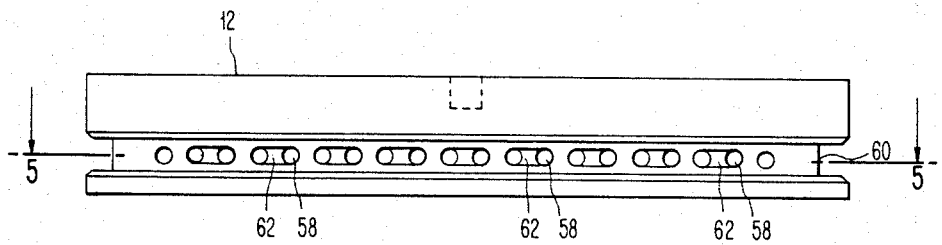
FIG. 6 is a side view of the upper electrode of FIG. 2.

FIG. 5 is a top cross-sectional view of electrode 12 showing the structure of a cooling passageway 56 formed therein. Referring also to FIG. 6, passageway 56 may conveniently be fabricated by forming a plurality of parallel, spaced apart holes 58 extending horizontally through electrode 12. A peripheral groove 60 is formed into electrode 12 coinciding with the holes 58, and a portion of the region between successive holes 58 is removed at the innermost surface of groove 60. Alternate open regions 62 are thus formed at the surface of groove 60 as shown in FIG. 5. In the final assembly of electrode 12, a ring 64 (shown in FIG. 1) is fitted into groove 60 and welded to close the ends of alternate holes 58. Alternatively, instead of the cross-section of ring 64 shown in FIG. 1, a ring may be provided whose outer surface is flush with the periphery of electrode 12 so that the outer surface of electrode 12 is smooth. With ring 64 inserted in groove 60, a single, continuous serpentine passageway 56 is formed in electrode 12 to provide for the flow of cooling fluid therethrough. Referring to FIG. 4, the cooling fluid is transferred to and from passageway 56 by a vertical inlet hole 66 and a similar outlet hole 68 which intersect the extreme ends of passageway 56 as shown in FIG. 2, and indicated by dashed lines in FIG. 5. Uniform distribution of the cooling fluid through electrode 12 is thereby provided.

Figure 7:
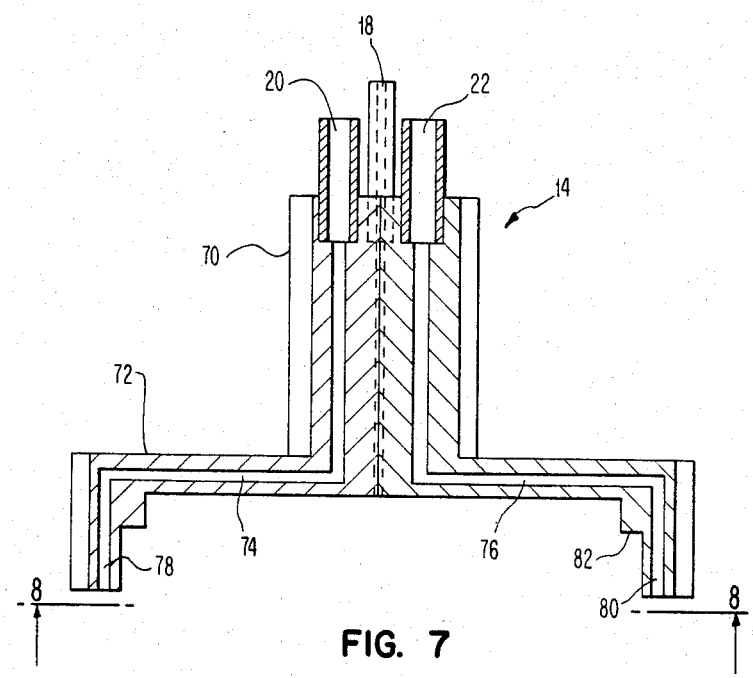
FIG. 7 is a cross-sectional side view of the plasma reactor inner housing of FIG. 1, taken along line 7—7 in FIG. 8.
Figure 8:
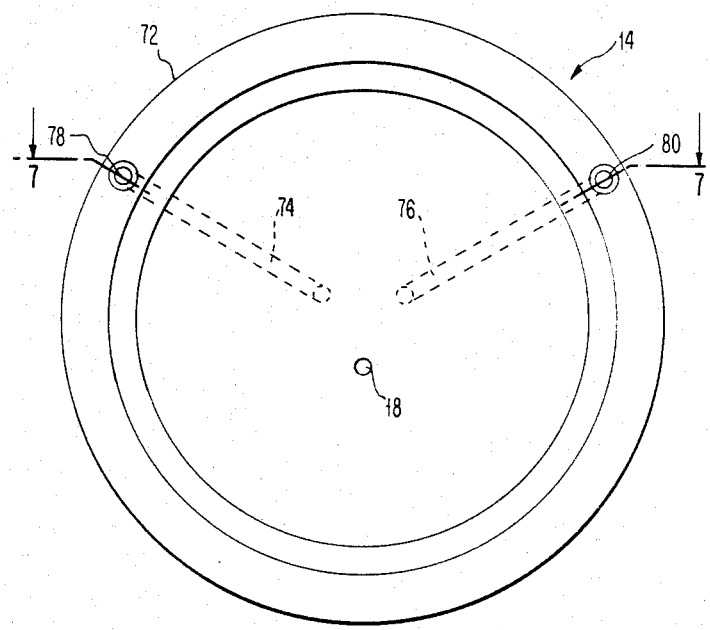
FIG. 8 is a bottom plan view of the inner housing as seen from the perspective of line 8—8 in FIG. 7.

Referring now to FIG. 7, there is shown a crosssectional side view of the inner housing 14 of FIG. 1. FIG. 8 is a bottom plan view as seen from the perspective of lines 8—8 in FIG. 7. Bell-shaped housing 14 has an extended upper portion 70 and a wider lower portion 72. Upper portion 70 has the vertical reactive gas passage 18 and cooling fluid passages 20, 22 formed therein. Gas inlet passage 18 extends to the lower surface of housing 14, while cooling fluid inlet and outlet passages 20 and 22 intersect horizontal passages 74 and 76, respectively, formed into lower portion 72. Passages 74 and 76 then intersect vertical passages 78 and 80, respectively, which extend to the lower surface of housing 14. Passages 78 and 80 are aligned respectively with inlet hole 66 and outlet hole 68 in upper electrode 12 as shown in FIG. 2. The various passageway interfaces between housing 14 and upper electrode 12 are sealed by O-rings in a conventional manner. Cooling fluid thus flows into inner housing 14 through inlet passages 20, 74 and 78, then through upper electrode 12 via inlet hole 66 and passage 56, and finally out of housing 14 through outlet hole 68 and passages 80, 76 and 22.

Baffle 16 is affixed to flange 82 of inner housing 14 intermediate upper electrode 12 and the outlet of reactive gas passageway 18 as shown in FIG. 1. Baffle 16 preferably includes a plurality of holes therethrough similar in size and configuration to holes 54 in upper electrode 12. However, the smaller (0.1-0.4 mm.) openings are facing upwards in FIG. 1, and the pattern of holes is arranged so that the holes in baffle 16 are not directly aligned with holes 54 in electrode 12. This configuration creates a pressure differential between the upper and lower surfaces of baffle 16 and assures a uniform distribution of reactive gas over the surface of upper electrode 12. Other baffle structures may be used to create the desired pressure differential, for example, a sintered baffle plate. However, a sintered baffle has the disadvantage of lengthening the time required to stabilize pressure prior to etching and to purge the reactor of reactive gas after an etching operation is completed.

Upper electrode 12 and the upper section 40 of lower electrode 38 may be fabricated from any conductive material that is compatible with the desired reactive gas and other process parameters, for example, stainless steel, aluminum, copper or the like. The insulating elements of plasma reactor 10, i.e., insulating housing 24, bushing 26, exhaust ring 28, clamp ring 36, lower section 42 of lower electrode 38, and insulating ring 44, may be plastic, nylon, glass ceramic, quartz, polytetrafluorethylene, or other suitable insulator. Baffle 16 can be one of the above conductive materials or sintered graphite. Inner housing 14 is conductive and outer housing 30, which may be either conductive or non-conductive, may be formed of any of the aforementioned conductive or insulating materials, the selection depending upon the reactive gas and the desired structural integrity and ease of fabrication. In the described embodiment, upper electrode 12, section 40 of lower electrode 38, baffle 16, inner housing 14 and outer housing 30 are aluminum. Insulating ring 44 is glass ceramic, section 42 of lower electrode 38 is plastic, and insulating housing 24, bushing 26, exhaust and spacing ring 28, and clamp ring 36 are nylon.

The present system achieves high plasma etch rates with uniform etching over the entire surface of the wafer. Contributing to this are the uniform reactive gas distribution, the extremely close spacing of the electrodes, and a high degree of plasma confinement. Since there are no conducting surfaces exposed to the upper electrode 12 other than the wafer, substantially all of the RF power from the plasma is dissipated by the wafer, thus assuring a high etch rate.

Surface 41 of lower electrode 38 is slightly smaller than the wafer to be etched, leaving a small overhang at the edge of the wafer. Further, because surface 45 of insulating ring 44 is slightly lower than surface 41, the wafer rests entirely on surface 41 to ensure good electrical contact between the wafer and the lower electrode. The vertical displacement between surface 41 and surface 45 is preferably approximately 1-2 orders of magnitude less than the gap between upper electrode 12 and lower electrode 38.

The elimination of wafer clamping, which is used in various prior reactors, minimizes reactive gas flow and electron density distortions at the wafer edge and makes available the entire surface of the wafer for integrated circuit fabrication.

It will be understood by those skilled in the art that the selection of the precise process parameters, i.e., reactive gas chemistry, RF power level and frequency, gas pressure and flow rate, etch time, etc., will depend upon the thickness and type of material to be etched. However, excellent results have been achieved with the present reactor using a variety of reactive gases for etching various materials. In one embodiment, the RF power density is greater than about 3 watts/cm$^2$, and a high reactive gas pressure, in the range of about 0.5-10 torr, is maintained in plasma region 46. The temperatures of upper electrode 12 and lower electrode 38 are regulated by passing chilled water therethrough, although other types of cooling fluid may also be used. The configuration of the present reactor, which permits the high RF volume power density and gas pressure, results in a substantially increased etch rate and etch uniformity as compared to prior reactors. This, in turn, decreases the required etch time, in many instances by an order of magnitude or more.

The disclosed reactor system was used to etch such materials as doped and undoped silicon, photoresists, polyimide and silicon dioxide. Etch rates of approximately 1.5 microns/min. for thermal $SiO_2$ in $CF_4$ and 4 microns/min. for polymeric materials in oxygen have been achieved. Of course, any material capable of being plasma etched can be processed by the reactor.

The present plasma reactor thus provides a single wafer, high pressure system which exhibits improved etch rates and etch uniformity for etching a variety of materials.

Obviously, many modifications and variations of the disclosed reactor system will become apparent to those skilled in the art given the benefit of the foregoing disclosure. It is to be understood that such modifications and variations may be made without departing from the spirit and scope of the present invention as defined by the appended claims.

What is claimed is:

1. Apparatus for plasma etching a semiconductor wafer comprising:
   a fluid cooled lower electrode for supporting said wafer;
   a fluid cooled upper electrode substantially parallel to and spaced apart from said lower electrode a distance such that the aspect ratio is greater than about 25, said upper electrode including means for distributing a reactive gas uniformly over said wafer;
   means for coupling RF power to one or both of said electrodes; and
   means for confining a plasma between said upper and lower electrodes.

2. The apparatus of claim 1 wherein said plasma confining means comprises:
   an insulating ring surrounding a raised portion of said lower electrode, said insulating ring having an upper portion extending above the upper surface of said lower electrode, and a channel formed into its inner surface such that the inner surface of said insulating ring is horizontally and vertically spaced apart from the upper exposed surface of said lower electrode, the upper portion of said insulating ring further including a plurality of radially extending passages therethrough for exhausting said reactive gas, wherein the inner surface of said insulating ring and the facing surfaces of said upper and lower electrodes form a plasma confinement region.

3. The apparatus of claim 2, further comprising:
   a first housing affixed to said upper electrode to form a plenum thereabove for said reactive gas, said first housing including a first passageway therethrough for communicating said reactive gas to said plenum and a plurality of second passageways therein for communicating a cooling fluid to and from said upper electrode;
   a second housing surrounding and spaced apart from said first housing, said second housing including reactive gas exhaust means; and
   an insulating housing intermediate said first and second housings to electrically isolate said first housing from said second housing, the outer surface of said insulating housing being spaced apart from said second housing to provide a passageway for said reactive gas from said insulating ring passageways to said second housing gas exhaust means.

4. The apparatus of claim 3, further comprising:
   baffle means affixed to said first housing in said plenum above said upper electrode to uniformly distribute said reactive gas to said upper electrode.

5. The apparatus of claim 1 wherein said upper electrode reactive gas distributing means comprises a plurality of vertical passageways therethrough, the width of each of said passageways decreasing from the upper surface to the lower surface of said upper electrode, and wherein said upper electrode includes an internal cooling passage to uniformly distribute a cooling fluid therethrough.

6. The apparatus of claim 1 wherein said lower electrode includes an internal cooling passage to uniformly distribute a cooling fluid therethrough, and an insulated lower portion to electrically isolate said lower electrode.

7. Apparatus for plasma etching a semiconductor wafer comprising:
   a fluid cooled lower electrode for supporting said wafer;
   a fluid cooled upper electrode substantially parallel to and spaced apart from said lower electrode, said upper electrode including means for distributing a reactive gas uniformly over said wafer;
   means for coupling RF power to one or both of said electrodes; and
   an insulating ring surrounding a raised portion of said lower electrode, said insulating ring having an upper portion extending above the upper surface of said lower electrode, and a channel formed into its inner surface such that the inner surface of said insulating ring is horizontally and vertically spaced apart from the upper exposed surface of said lower electrode, the upper portion of said insulating ring further including a plurality of radially extending passages therethrough for exhausting said reactive gas, wherein the inner surface of said insulating ring and the facing surfaces of said upper and lower electrodes form a plasma confinement region.

8. The apparatus of claim 7 wherein said upper electrode reactive gas distributing means comprises a plurality of vertical passageways therethrough, the width of each of said passageways decreasing from the upper surface to the lower surface of said upper electrode, and wherein said upper electrode includes an internal cooling passage to uniformly distribute a cooling fluid therethrough.

9. The apparatus of claim 8 wherein said lower electrode includes an internal cooling passage to uniformly distribute a cooling fluid therethrough, and an insulated lower portion to electrically isolate said lower electrode.

10. The apparatus of claim 9, further comprising:
    a first housing affixed to said upper electrode to form a plenum thereabove for said reactive gas, said first housing including a first passageway therethrough for communicating said reactive gas to said plenum and a plurality of second passageways therein for communicating a cooling fluid to and from said upper electrode;
    a second housing surrounding and spaced apart from said first housing, said second housing including reactive gas exhaust means; and
    an insulating housing intermediate said first and second housings to electrically isolate said first housing from said second housing, the outer surface of said insulating housing being spaced apart from said second housing to provide a passageway for said reactive gas from said insulating ring passageways to said second housing gas exhaust means.

11. The apparatus of claim 10, further comprising:
baffle means affixed to said first housing in said plenum above said upper electrode to uniformly distribute said reactive gas to said upper electrode.

12. Apparatus for plasma etching a semiconductor wafer comprising:
 a lower electrode for supporting said wafer, said lower electrode having an insulated lower portion and an internal cooling passage to uniformly distribute a cooling fluid therethrough;
 an upper electrode substantially parallel to and spaced apart from said lower electrode, said upper electrode having an internal cooling passage to uniformly distribute a cooling fluid therethrough and a plurality of vertical passageways therethrough for distributing a reactive gas uniformly over said wafer, wherein the width of each of said vertical passageways decreases from the upper surface to the lower surface of said upper electrode;
 means for coupling RF power to one or both of said electrodes; and
 an insulating ring surrounding a raised portion of said lower electrode, said insulating ring having an upper portion extending above the upper surface of said lower electrode, and a channel formed into its inner surface such that the inner surface of said insulating ring is horizontally and vertically spaced apart from the upper exposed surface of said lower electrode, the upper portion of said insulating ring further including a plurality of radially extending passages therethrough for exhausting said reactive gas, wherein the inner surface of said insulating ring and the facing surfaces of said upper and lower electrodes form a plasma confinement region.

13. The apparatus of claim 12, further comprising:
a first housing affixed to said upper electrode to form a plenum above said upper electrode for said reactive gas, said first housing including a first passageway therethrough for communicating said reactive gas to said plenum and a plurality of second passageways therein for communicating a cooling fluid to and from said upper electrode;
a second housing surrounding and spaced apart from said first housing, said second housing including reactive gas exhaust means; and
an insulating housing intermediate said first and second housings to electrically isolate said first housing from said second housing, the outer surface of said insulating housing being spaced apart from said second housing to provide a passageway for said reactive gas from said insulating ring passageways to said second housing gas exhaust means.

14. The apparatus of claim 13, further comprising:
baffle means affixed to said first housing in said plenum above said upper electrode to uniformly distribute said reactive gas to said upper electrode.

* * * * *